(12) United States Patent
Tegeder et al.

(10) Patent No.: US 6,745,637 B2
(45) Date of Patent: Jun. 8, 2004

(54) SELF-SUPPORTING ADAPTABLE METROLOGY DEVICE

(75) Inventors: Volker Tegeder, Weissig (DE); Detlef Gerhard, München (DE); Johannes Lechner, München (DE); Eckhard Marx, Radeburg (DE)

(73) Assignees: Infineon Technologies SC300 GmbH & Co. KG, Dresden (DE); Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/090,259

(22) Filed: Mar. 4, 2002

(65) Prior Publication Data

US 2002/0152808 A1 Oct. 24, 2002

(30) Foreign Application Priority Data

Mar. 2, 2001 (EP) .............................. 01105179

(51) Int. Cl.⁷ ............................................... G01N 19/00
(52) U.S. Cl. ................ 73/865.9; 414/222.13; 414/935; 438/14
(58) Field of Search .......................... 414/222.13, 935, 414/939, 937; 73/865.9, 866.5; 438/14; 118/715, 719; 134/61, 201; 219/385, 393, 482

(56) References Cited

U.S. PATENT DOCUMENTS

| | | | |
|---|---|---|---|
| 4,852,516 A | | 8/1989 | Rubin et al. |
| 5,364,219 A | * | 11/1994 | Takahashi et al. ........... 414/939 |
| 5,380,682 A | * | 1/1995 | Edwards et al. ............ 438/800 |
| 6,053,687 A | | 4/2000 | Kirkpatrick et al. |
| 6,334,922 B1 | * | 1/2002 | Tanaka et al. ............... 156/234 |
| 6,452,201 B1 | * | 9/2002 | Wang et al. ........... 250/559.29 |
| 6,504,144 B1 | * | 1/2003 | Murata ....................... 250/224 |
| 6,592,318 B2 | * | 7/2003 | Aggarwal .................... 414/939 |

FOREIGN PATENT DOCUMENTS

| | | |
|---|---|---|
| EP | 0 377 464 A2 | 7/1990 |
| EP | 1 139 390 A1 | 10/2001 |

* cited by examiner

*Primary Examiner*—Hezron Williams
*Assistant Examiner*—Nashmiya Fayyaz
(74) *Attorney, Agent, or Firm*—Laurence A. Greenberg; Werner H. Stemer; Gregory L. Mayback

(57) ABSTRACT

A metrology device is described which is couplable to a load port of a semiconductor product handling and/or processing tool. The tool encloses a mini-environmental atmosphere and has a load port table for supporting devices to be coupled to the load port. The metrology device contains a housing preserving an inner atmosphere, a coupling region for connecting the inner atmosphere to the mini-environmental atmosphere and a measuring device for measuring a property of a semiconductor product. The metrology device further has a support which is movable by a transport device and which is dimensioned such that the metrology device is self-supporting in a position appropriate for coupling the coupling region to the load port. The metrology device is thereby couplable to the load port without being supported by the load port table.

22 Claims, 5 Drawing Sheets

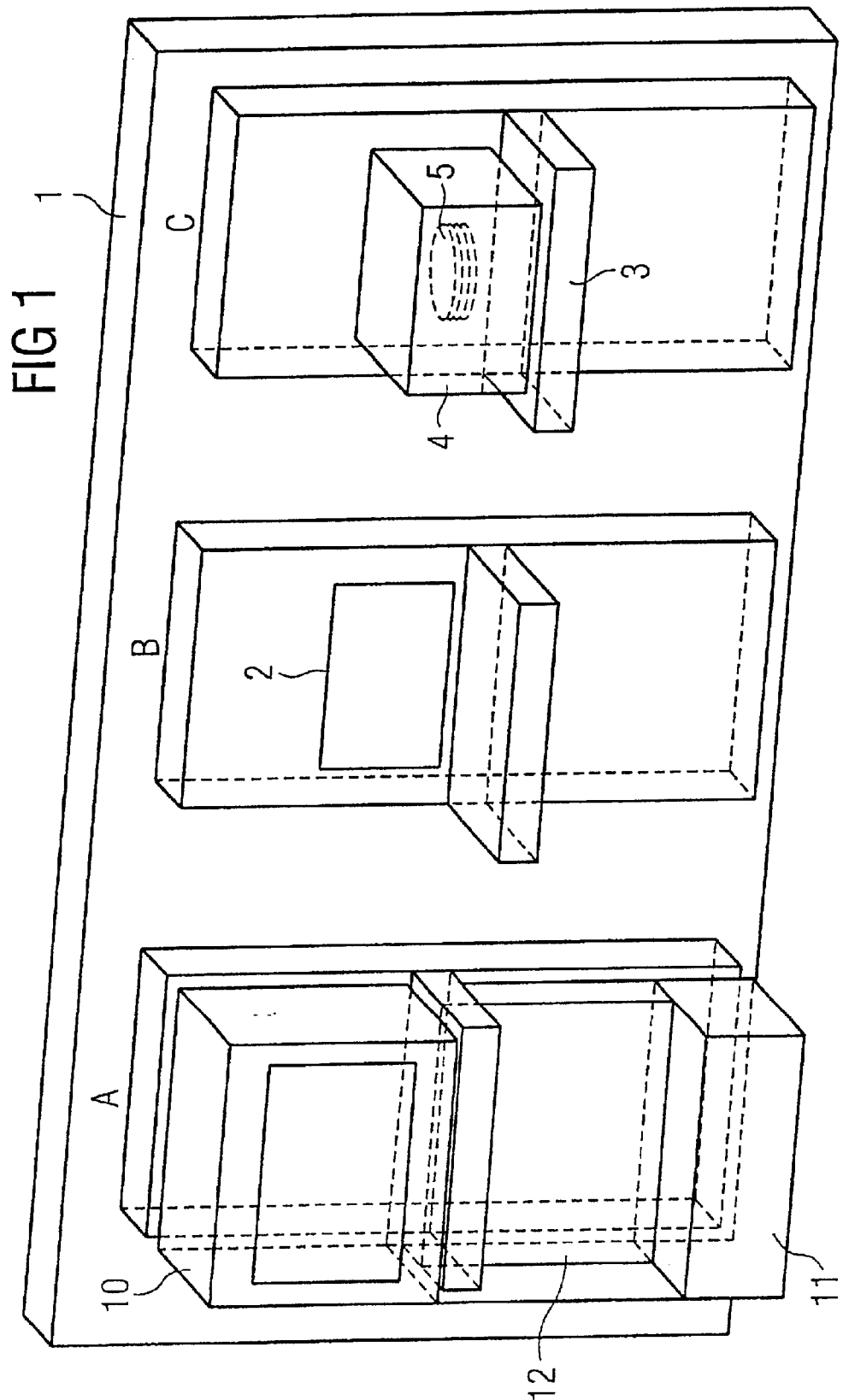

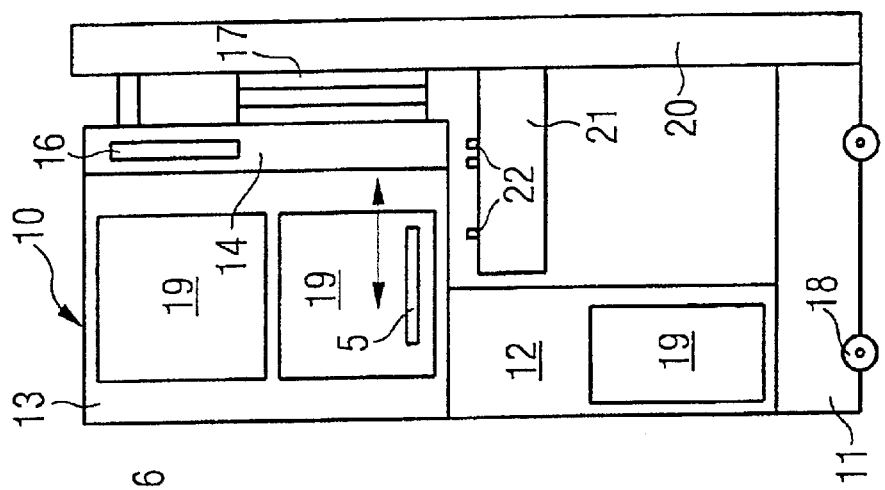
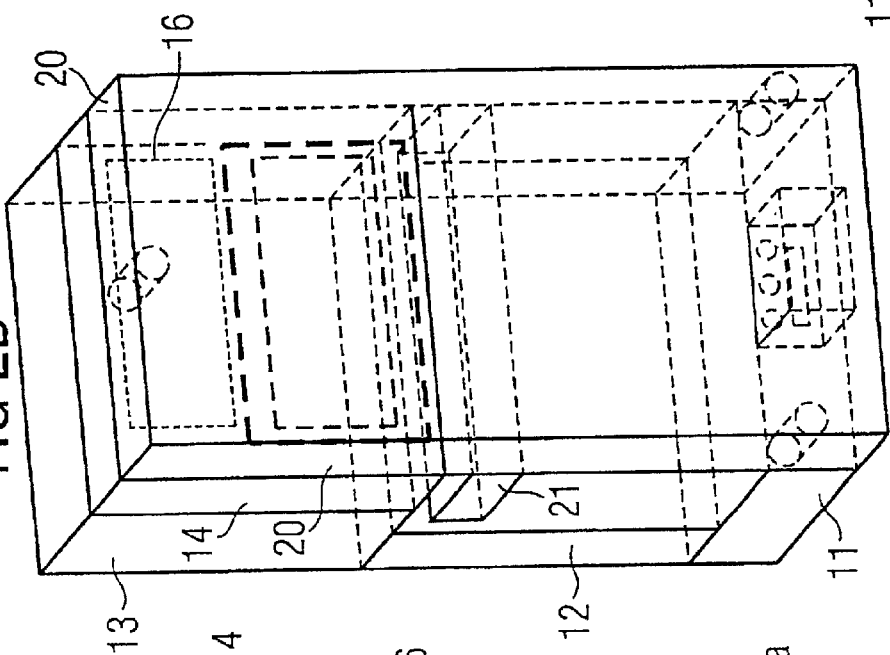
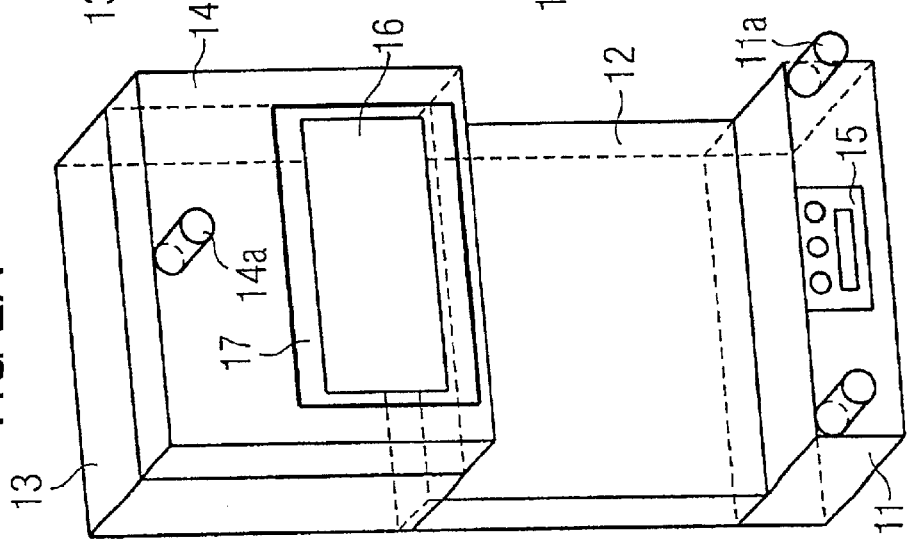

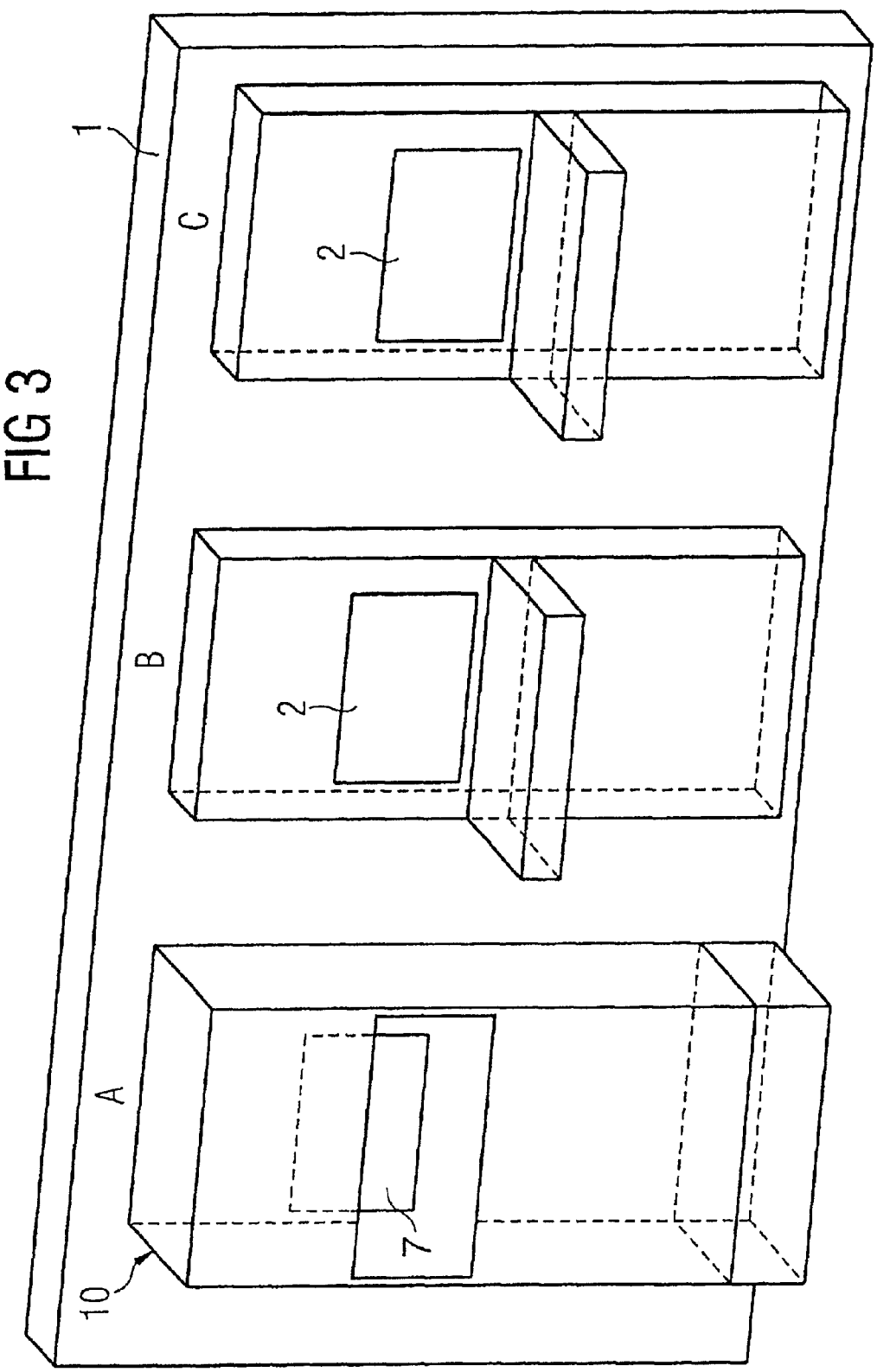

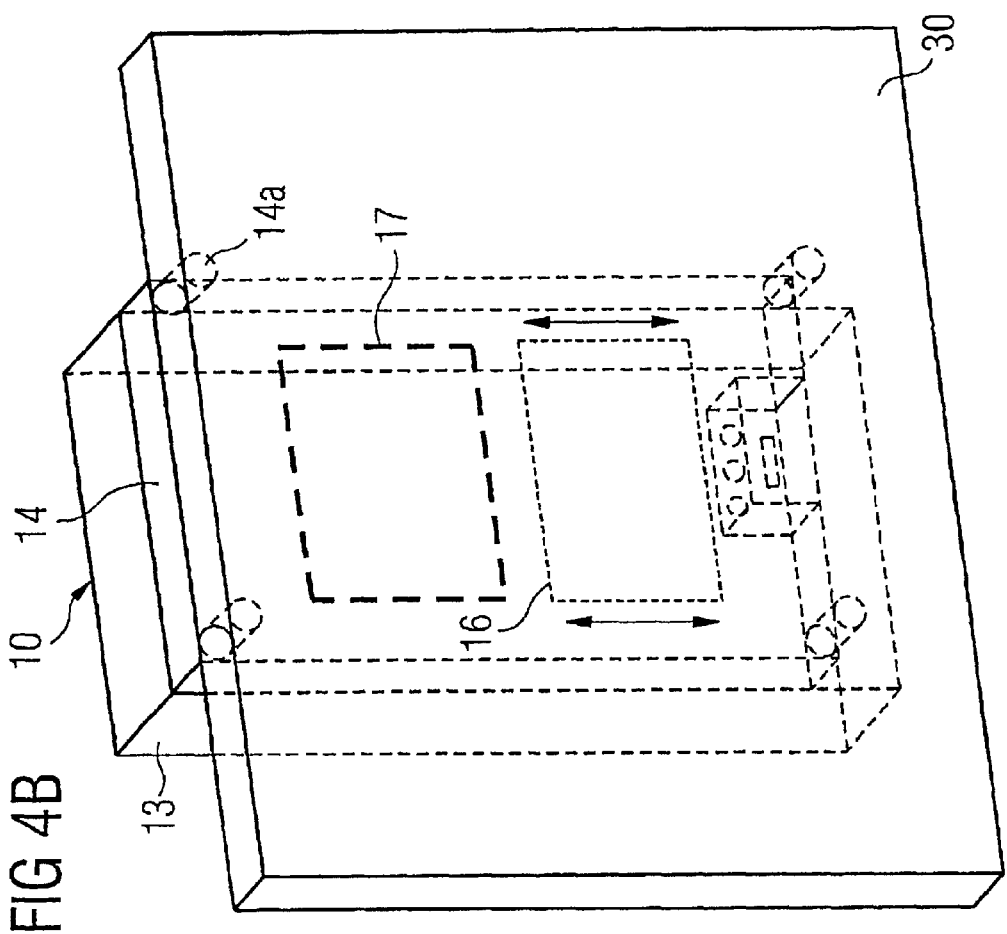
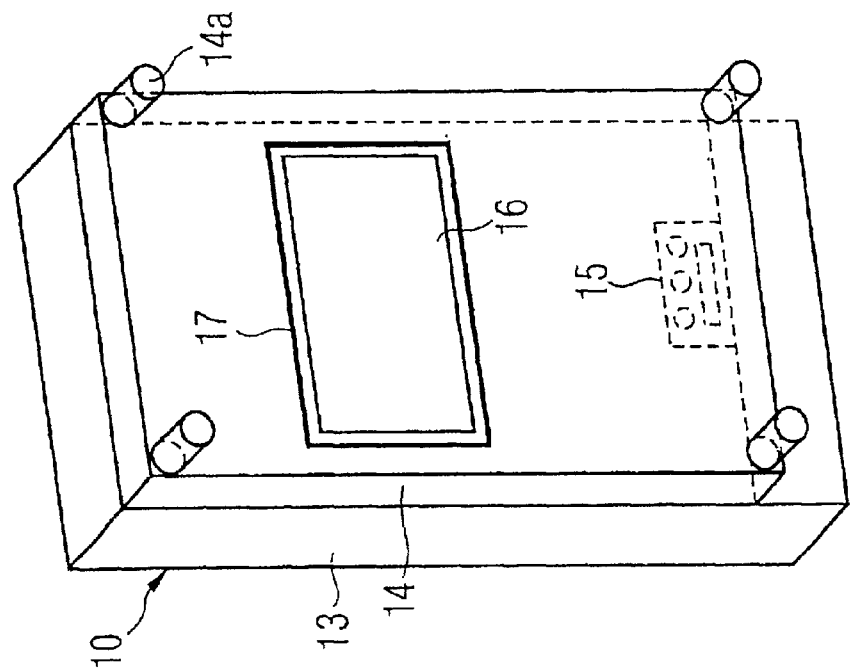

SELF-SUPPORTING ADAPTABLE METROLOGY DEVICE

BACKGROUND OF THE INVENTION

FIELD OF THE INVENTION

The invention refers to a metrology device couplable to a load port of a semiconductor product handling and/or processing tool which tool encloses a mini-environmental atmosphere and has a load port table for supporting devices to be coupled to the load port. The metrology device contains a housing preserving an inner atmosphere, a coupling region for connecting an inner atmosphere to a mini-environmental atmosphere, and a measuring device for measuring a property of a semiconductor product.

In the manufacture of semiconductor products, several process steps are performed by process tools which are, for instance, combined to cluster tools including one wafer handling tool. Within the cluster tools the semiconductor products are handled and processed within a mini-environment that is a clean room atmosphere of higher purity than the clean room atmosphere accommodating operating personnel and the cluster tools. Due to the complexity of modern semiconductor product processing often requires several hundred processing steps, intermediate control of processing results and physical, chemical, or other properties of the semiconductor products is necessary. Often the necessity of controlling such a property arises during semiconductor product processing. In any case, measurements have to be performed during or interrupting, respectively, a rather complex process routine.

With a view to the costs of running processing tools, it would be desirable to minimize the interruption time caused by the measurements. However, due to the mini-environmental clean room requirements, the semiconductor products must not contact the outer atmosphere surrounding the processing tools.

In order to preserve the mini-environmental atmosphere, wafers are intermediately stored in so-called front-opening unified pods (FOUPs) docked at a load port. The load port is a device for loading or unloading FOUPs. Usually, load ports are allocated at front-end process modules for wafer handling and loading and unloading process tools.

The FOUP containing a semiconductor product also preserves the mini-environmental atmosphere around it and hence allows for an air-tight transport of the semiconductor product within the outer clean room atmosphere of minor purity. The semiconductor product in the FOUP is transported to a second load port connected to a measuring tool, unloaded, subjected to the measurement, reloaded and transported to the load port connected to the cluster tool in order to continue the semiconductor processing.

Due to this proceeding, semiconductor products to be measured have to be transported twice. In order to save time and efforts for transport, it would be possible to permanently combine the measurement device with the cluster tool. In this case, FOUP transport would not be required. However, this is not realized up to now because of several reasons.

First, measurement devices are supplied by various engineering companies. Each measurement device of any one of the companies would require high efforts for integration into and interaction with highly automated cluster tools. It is not profitable to spend time and costs for extending the cluster each time when any measurement device of one of the various suppliers is integrated.

Second, such integration efforts would arise already in advance before testing the compatibility of a measurement device and a cluster tool. As the compatibility has to be proven before selecting a measurement device of a particular supplier, the integration costs would add up to the costs of the devices chosen or, with respect to those devices not bought from the other suppliers, would be spent to no purpose.

Finally, present FOUPs and load ports are standardized and therefore offer simple connection to stand-alone measuring devices.

For these reasons, wafers to be subjected to a measurement are transported to and from the load port connected to such measurement device.

A FOUP ordinarily employed for exclusively transporting wafers may contain a sensor for measuring a property of a wafer allocated in the FOUP. As the housing of the FOUP preserves the mini-environment and the FOUP is easily coupled by its coupling region to the cluster tool, the measurement can be performed directly at the load port; the need of transport no longer arises.

The load ports themselves, however, must maintain mini-environmental atmospheric conditions when a FOUP is docked thereto. In no case can any leakage between the FOUP and the load port be tolerated. Therefore, a special seal is located between the load port and the FOUP and surrounds a passage for transferring a wafer between the load port and the FOUP.

Effective passage seals as well as wafer handling require exact positioning of the FOUP relative to the load port. To this end, a load port contains a table with three pins supporting the FOUP when it is docked to the seal of the load port. Exact positioning of the FOUP is provided by the suppliers of the load port only to a certain maximum weight of the FOUP. In 300 mm production, the maximum weight amounts to about 12 kg and approximately corresponds to the weight of a FOUP loaded with the maximum number of wafers allowed.

When a metrology device is integrated in a FOUP, the maximum weight must not be exceeded because otherwise exact positioning could not be granted so that a leakage of the seal might occur. As a consequence, only lightweight metrology devices as sensors requiring little hardware and software equipment can be integrated into a FOUP.

SUMMARY OF THE INVENTION

It is accordingly an object of the invention to provide a self-supporting adaptable metrology device which overcomes the above-mentioned disadvantages of the prior art devices of this general type, which, regardless of its dimensions or weight, can rapidly be coupled to a semiconductor product handling and/or processing tool with very little effort and which grants for comparable leakage prevention during coupling and decoupling as the lightweight FOUP does. It is a further object of the invention to provide a metrology device which is adaptable to a semiconductor product handling and/or processing tool via a load port having a load port table and thus being constructed for the coupling of wafer containers (which at the most might contain small and light weight measuring tools) exclusively.

With the foregoing and other objects in view there is provided, in accordance with the invention, a metrology device couplable to a load port of a semiconductor product tool enclosing a mini-environmental atmosphere and having a load port table for supporting devices to be coupled to the load port. The metrology device contains a housing preserving an inner atmosphere, a coupling region for connecting the inner atmosphere to the mini-environmental atmosphere and extends from the housing, a measuring device for measuring a property of a semiconductor product, a transport device, and a support supported by and movable over ground by the transport device. The support supports the housing and the measuring device. The support is dimensioned such that the metrology device is self-supporting in a position appropriate for coupling the coupling region to the load port, the metrology device is thereby couplable to the load port without being supported by the load port table.

According to the invention, the object is achieved by a metrology device of the kind now described which is constructed containing a support which is movable on the ground by the transport device and which support is dimensioned such that the metrology device is self-supporting in a position appropriate for coupling the coupling region to the load port. The metrology device thereby being couplable to the load port without being supported by the load port table.

The general idea underlying the invention is, proceeding from the above-mentioned load port FOUP support, to position the metrology device independently and separately from any maximum weight depending support members of the cluster tool. Whereas according to prior art both mechanical positioning and atmospheric connection or isolation, respectively, are achieved by the load port forming part of the cluster tool, according to the invention merely the atmospheric connection is primarily achieved by the cluster tool whereas mechanical positioning and support are achieved by the metrology device itself regardless of positioning members eventually existing at each cluster tool present.

Preferably, the metrology device is self-supporting on the ground located at a vertical position deeper than the vertical position of the load port table of the load port. Thereby the device is couplable to the load port constructed for lightweight wafer compartments which usually are not self-supporting when supported by the load port table.

To this end, preferably the self-supporting metrology device is constructed such that the coupling region is located in a height appropriate for coupling to the tool. The height corresponds to the sum of the height of the load port table above the ground and the height of a coupling region of the tool (to be engaged with the coupling region of the metrology device) above the load port table. Thus preferably the coupling region is supported in a vertical position higher than the vertical position of an upper side of the load port table.

According to a preferred embodiment the support of the metrology device has a recess for accommodating the load port table. Preferably the recess is dimensioned to accommodate the load port table extending horizontally in front of the load port to which the metrology device is coupable to, the recess being allocated at a deeper vertical position than the coupling region. The recess in the support of the metrology device allows for close approximation of the metrology device and the load port, the load port table being unused for coupling of the metrology device being suitably accommodated in the recess.

Preferably an upper portion of the metrology device including the coupling region is supported in a position preventing contact to contact members. More preferably the upper portion of the metrology device including the coupling region is supported in a position preventing contact to cinematic coupling pins of the load port. A load port contains a three pins for holding a wafer compartment of a predefined range of weight in a predefined vertical (and lateral) position relative to the coupling region of the tool. The pins hinder placing large weight compartments or metrology devices on the load port table since the cinematic coupling pins and their support in the load port table may be damaged by a large weight of a device supported. The standardized load port tables contains pin allocated for FOUP support up to the maximum weight allowed. The contact pins are no longer necessary as according to the invention the metrology device is self-supporting. A gap of at least several millimeters is recommendable between the upper side of the load port table and that portion of the metrology device extending above the load port table in order to prevent unintentional damage of the FOUP support pins when coupling the metrology device to the load port. In contrast to the destine of the load port table and of the cinematic coupling pins, the metrology device is self-supporting in a position appropriate for coupling of the coupling region to the load port. Furthermore, the metrology device is self-supporting in a position appropriate for very quick coupling since the metrology device can slidably or rollably be attached to the tool.

According to a preferred embodiment, the support forms part of the housing preserving the inner atmosphere. Accordingly, a complete volume of the metrology device can be coupled to mini-environmental atmosphere. This saves coupling stations as according to this embodiment several semiconductor products can be measured or various measurements can be performed within one single mini-environmental metrology device. Hence, preferably also the support is constructed to accommodate a measuring device.

Preferably, the support contains means for adapting the position of the metrology device to different sizes of tools. Though load ports are standardized, there are different standard dimensions preventing unique coupling of one single housing lacking any size adaptation facilities. Preferably, the height of the coupling region of the metrology device extending above the load port table may be variable. Thereby any particular metrology device can be coupled to cluster tool coupling regions of different standard sizes.

According to a preferred embodiment of the invention, the metrology device is constructed to receive a semiconductor product through an opening of the coupling region in order to perform the measurement inside the housing. As a consequence, the handling tool of the front-end process module of a cluster tool can be utilized for other handling operations during measurement. Furthermore, performing the measurement in the housing of the metrology device allows for the nearest contact of the measuring equipment to the semiconductor surface from all directions. However, alternatively, the metrology device may interact with the cluster tool, for instance by measurement sensors protruding into an opening of the cluster tool, for performing the measurement.

The transport devices of the support preferably form part of the support. Preferably, they are rollers.

According to another preferred embodiment of the invention, the support contains a docking region mechanically dockable to the tool. This construction may be developed to form further advantageous embodiments.

First, the docking region may contain members for fixing a position of the metrology device relative to the tool. These members may be mechanically lockable pins. Preferably, both the coupling region usually located above as well as the docking region of the support located beneath are equipped with locking members so that stability of the metrology device coupled to the cluster tool is increased in case of uneven ground. However, the coupling region primarily serves to atmospherically couple the metrology device and the cluster tool and isolate them from the surrounding clean room atmosphere of minor purity.

Second, the docking region preferably may contain a conduct region coupleable to the tool. The conduct region serves to supply all media and other sources that are required for driving the metrology device. Thereby a plug-and-play performance of the complete metrology device is granted. Preferably, the conduct region supplies data transfer, power, pressured gas or other media from the tool to the metrology device. Furthermore, the conduct region may contain exhaust lines for exhaust transport of gases from the metrology device to the tool.

With view to the function of the coupling region of connecting the inner atmosphere to the mini-environmental atmosphere, the coupling region preferably contains a respective seal. However, the cluster tool may have a seal instead. Preferably, both the cluster tool and the metrology device contain a respective seal interacting with one another in order to more safely prevent any leakage of mini-environmental atmosphere.

Preferably, the coupling region and/or the support contain elements for vibration damping. Furthermore, the metrology device may contain a table for vibration damping, the table preferably is formed of granite or another kind of stone and configured to have a great mass.

According to advanced preferred embodiments of the invention, the metrology device is configured as a cluster device. Preferably, it is a cluster device containing a measuring device for measuring at least two properties of a semiconductor product. Alternatively or in addition, the metrology device is a cluster tool containing a measuring device for measuring properties of at least two semiconductor products.

According to the invention a system contains a load port for a semiconductor product handling and/or processing tool which tool encloses a mini-environmental atmosphere and has a load port table for supporting devices to be coupled to the load port. The system contains the metrology device as disclosed above. The system provides a new coupling technique of devices to be coupled to a tool having a table for supporting them when being coupled. The coupling technique according to the invention is independent of table dimensions and of the weight of the device.

Other features which are considered as characteristic for the invention are set forth in the appended claims.

Although the invention is illustrated and described herein as embodied in a self-supporting adaptable metrology device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 a perspective view of a front side wall of a cluster tool, the front side contains three load ports A, B, C, load port A being occupied by a metrology device according to the invention and load port C being occupied by a standardized FOUP to be loaded with wafers and destined for manual transport of the wafers to another load port connected to a non-illustrated stand-alone measuring tool;

FIGS. 2A and 2B are perspective views of a backside of the metrology device according to the invention and the load port connected to the metrology device as well as a side view of the metrology device and the load port connected to each other;

FIG. 2C is a cross-sectional view of FIG. 2B;

FIG. 3 is a perspective view of the front side wall of the cluster tool containing two load ports and a third docking station other than a load port, the docking station being occupied by the metrology device according to a second embodiment of the invention;

FIGS. 4A and 4B are perspective views of the backside of the metrology device according to the second embodiment of the invention and of the cluster tool wall connected to the metrology device.

DESCRIPTION OF THE PREFERRED EMBODIMENTS

Figure 5:
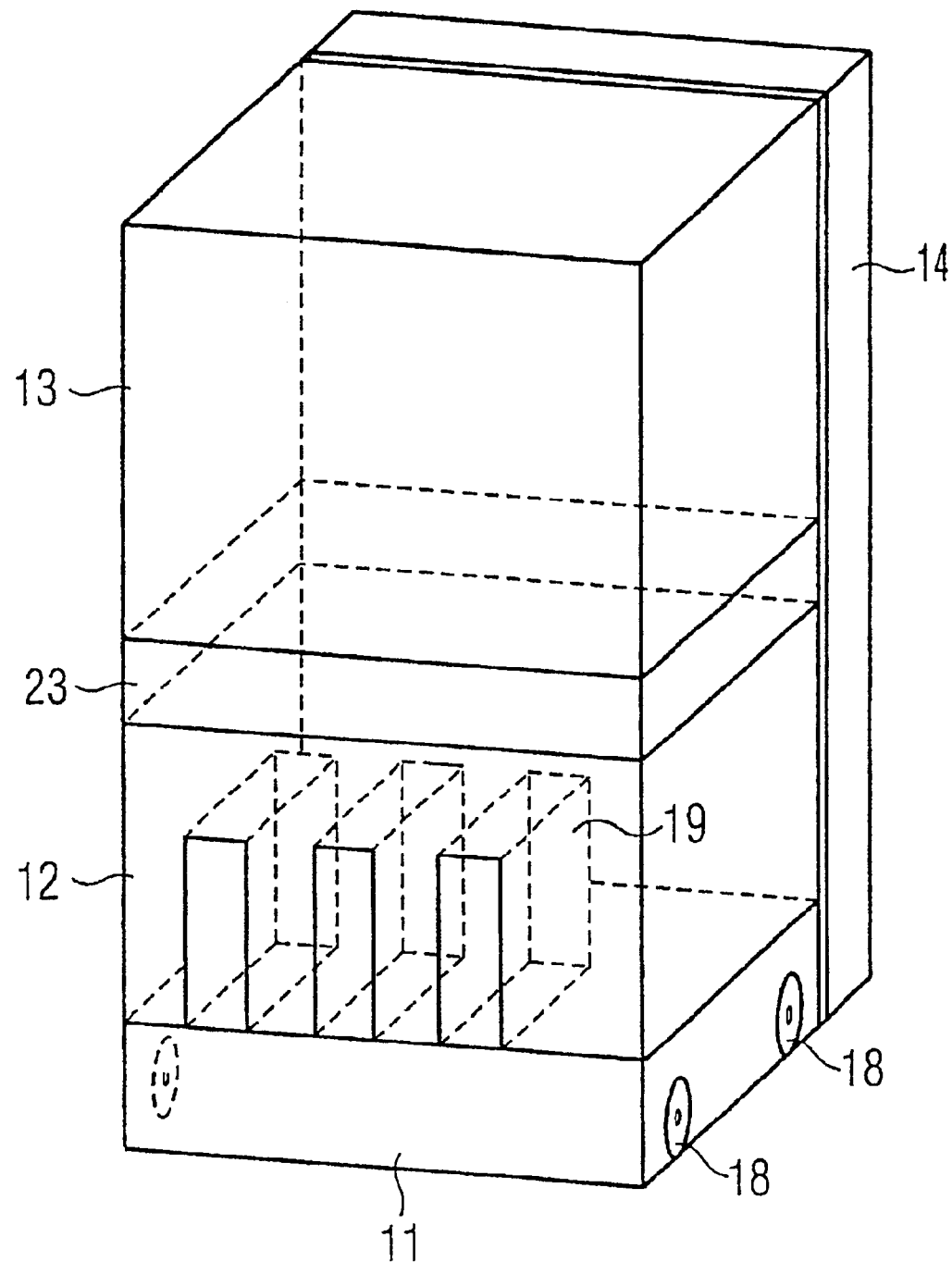
FIG. 5 is a perspective view of the second embodiment of the invention.

Referring now to the figures of the drawing in detail and first, particularly, to FIG. 1 thereof, there is shown a front side wall 1 of a cluster tool that contains three load ports A, B, C. Load port B is not occupied; its opening 2 is closed in order to prevent any leakage of the mini-environmental atmosphere.

Load port C is occupied according to prior art with a front-opening unified pod (FOUP) 4 schematically illustrated and being supported by a load port table 3.

The load port A is occupied by a metrology device 10 according to the present invention. The metrology device 10 contains a support 11, 12 illustrated in detail in FIG. 2A.

FIGS. 2A and 2B illustrate details of the metrology device 10 according to the invention in a perspective view from behind. An upper portion 13 of the metrology device 10 contains a coupling region 14 to be coupled to the cluster tool. The support of the metrology device 10 contains a docking region 11 to be docked simultaneously with the coupling region 14 to the cluster tool. The support further contains a height adaptation module 12 dimensioned such that the metrology device 10 is self-supporting in a position appropriate for quick coupling of the coupling region 14 to the cluster tool. A housing preserving an inner atmosphere which is the mini-environmental atmosphere when connected to the cluster tool may contain the upper portion 13 only or the complete housing of the metrology device 10 including the support 11, 12. In any case, the support 11 contains a conduct region 15 coupleable to the tool for supplying data transfer, power, pressure, gas, or other media from the cluster tool to the metrology device 10 or for exporting exhaust gases from the metrology device 10 to the cluster tool. Conduct lines not illustrated in FIG. 2A extend from the coupling region 15 through the support 11, 12 to the upper portion 13 or to any region within the support 11, 12 forming part of the inner atmosphere surrounded by the housing 13, 12, 11. Data transfer or power, however, may be supplied also to a region external to the housing enclosing the inner atmosphere as in the case of computing devices not necessarily allocated within a mini-environmental atmosphere.

The coupling region 14 and the docking region 11 contain members 14a, 11a for fixing a position of the metrology device 10 relative to the tool. Preferably, the members 14a, 11a are lockable pins engaging in corresponding recesses in front of the load port illustrated in FIG. 2B. A load port 20 contains a load port table 21 extending into the footprint occupied by the metrology device 11, 12, 13. For this reason, the support region 12 has less extension in a direction perpendicular to the drawing plane than the support region 11 and the upper device portion 13. Hence, the support region 12 forms a recess for accommodating the load port table 21.

As there are different standardized load ports and, as a consequence, different possible heights of the load port tables 21, the recess between the regions 13 and 11 extends far below the load port table 21 illustrated in FIG. 2C. The coupling region 14 is constructed to contain a door 16 closing an opening surrounded by a seal 17. The door 16 may be removed from the opening when the metrology device 10 is coupled to the load port 20 of the cluster tool as illustrated in FIGS. 2B and 2C.

FIG. 2C illustrates the metrology device 10 docked to the load port 20 in cross-sectional view. The support 11 is movable on over ground by transport devices 18 that in the simplest case may be rollers 18. The upper portion 13 of the metrology device 10 as well as the support 11, 12 accommodate a measuring device 19 for measuring a property of a semiconductor product. Compared to the FOUP 4 docked at the load port C in FIG. 1 and schematically drawn larger than in reality, the metrology device 10 according to the invention as illustrated in FIG. 2C may be of unlimited size and weight and couple to the load port 20 of the cluster tool. Whereas the load port 20 is used for coupling the FOUP 4 for wafer loading and unloading for the purpose of transport and, as a consequence, pins 22 in FIG. 2C only serve as FOUP support members according to prior art. The pins 22 are not employed when coupling the metrology device 10 according to the present invention to the load port 20. For this reason, the upper portion 13 of the metrology device 10 is supported in a position preventing contact with the pins 22 of the load port table 21. The metrology device 10 illustrated in FIG. 2C may contain several measuring devices 19 for measuring properties of several semiconductor products and/or for measuring several properties of one or more semiconductor products 5. Hence, the cluster metrology device 10 directly coupled to the cluster tool eliminates the need of manual transport of wafers 5 in FOUPs. Hence, intermediate measurement between two process steps at the same cluster tool does not delay subsequent process steps.

FIGS. 3 to 5 illustrate a second embodiment of the invention. FIG. 5 illustrates the metrology device coupleable to a front-end process module 1' illustrated in FIG. 3. The front-end process module 1' in FIG. 3 contains two load ports B and C that are not occupied. In region A of the front-end process module 1', the metrology device 10 according to the second embodiment of the invention is coupled with the front-end process module 1'. Details of the front of the process module 1' and of the backside of the metrology device 10 are not visible in FIG. 5 as they are illustrated in FIGS. 4a and 4B showing the metrology device 10 in perspective view from behind. However, the coupling region 14 contains a closeable opening similar to the openings 2 of the load ports B and C.

FIGS. 4A and 4B illustrate the coupling region 14 of the housing 13 preserving the inner atmosphere of the metrology device 10. In FIG. 4B, the coupling region 14 is coupled to a wall 30 of the process module 1'. The front-end process module 1' usually serves for wafer handling, prealignment, and wafer identification and is located at the front of the cluster tool. The front side of the front-end process module 1' usually contains the load ports. The metrology device 10 may be coupled to a front side wall at a location not containing a load port as is illustrated in FIG. 3. However, alternatively, the wall 30 in FIG. 4B can also be a right-hand or left-hand side wall of the front end process module 1'. As apparent from FIG. 3, the wall 30 contains a closeable opening 7. However, it is not possible to couple a FOUP to the opening 7 as there is no support like a load port table at the wall 30. Instead, the opening 7 is coupled with the coupling region 14 illustrated in FIG. 4A such that the opening 7 of the cluster tool and an opening 16' of the metrology device 10 are located opposite to each other. The seal 17 surrounds the passage between both openings and thereby allows for coupling of the mini-environmental atmosphere of the cluster tool and the inner atmosphere of the metrology device 10 by isolating the passage between the openings from the atmosphere surrounding both the metrology device 10 and the cluster tool when these are combined with each other as illustrated in FIG. 4B. The coupling region 14 of the metrology device 10 contains four lockable pins 14a protruding into the wall 30 of the cluster tool in FIG. 4B. However, the metrology device 10 is self-supporting so that the pins 14a do not carry the metrology device 10.

FIG. 5 illustrates the metrology device 10 from a front-side perspective view. It is supported by the rollers 18 and contains the housing 13 enclosing a mini-environmental atmosphere in an upper part of the metrology device 10 supported by a table 23 for vibration damping. Beneath the table 23, the support 11, 12 accommodates additional measuring devices 19 not necessarily enclosed by the mini-environmental atmosphere. However, there may be conduct lines in the support 11, 12 supplying the housing 13 with media from the media connector block 15 shown in FIG. 4A from the cluster tool. The coupling region 14 may cover the whole back wall of the metrology device 10, the position of the docking region 15 in FIG. 4A is only exemplary.

According to the present invention, any measuring device may be coupled to the cluster tool. Furthermore, a device for wafer transfer, xy-rotation wafer stages, wafer identification, and sensor movement may be integrated in the metrology module 10. Measuring devices preferably accommodated in the support of the metrology device 10 are standard frames, electronics, personal computers, etc. The support may contain a transport module 11 with rollers or adjustable feet with vibration dampers as the transport device 18. Further embodiments of the invention will be apparent to those familiar with the state of the art.

We claim:

1. In combination with a semiconductor product tool enclosing a mini-environmental atmosphere and having a load port and a load port table for supporting devices to be coupled to the load port, the load port table having contact members including cinematic coupling pins, a metrology device to be coupled to the load port, the metrology device comprising:

a housing preserving an inner atmosphere;

a coupling region for connecting said inner atmosphere to the mini-environmental atmosphere and extending from said housing, said housing and said coupling region forming an upper portion supported in a position preventing contact with the contact members of the load port table;

a measuring device for measuring a property of a semiconductor product;

a transport device; and a support supported by and movable over ground by said transport device, said support supporting said housing and said measuring device, said support dimensioned to cause the metrology device to be self-supporting in a position appropriate for coupling said coupling region to the load port.

2. The metrology device according to claim 1, wherein the metrology device is self-supporting on the ground located at a vertical position deeper than a vertical position of the load port table of the load port.

3. The metrology device according to claim 1, wherein said coupling region is located at a height appropriate for coupling to the semiconductor product tool.

4. The metrology device according to claim 3, wherein said coupling region is supported in a vertical position higher than a vertical position of an upper side of the load port table.

5. The metrology device according to claim 1, wherein said support has a recess formed therein for accommodating the load port table.

6. The metrology device according to claim 5, wherein said recess is dimensioned to accommodate the load port table extending horizontally in front of the load port to which the metrology device is coupable to, said recess being allocated at a deeper vertical position than said coupling region.

7. The metrology device according to claim 1, wherein the metrology device is a cluster device containing said measuring device for measuring properties of at least two semiconductor products.

8. The metrology device according to claim 1, wherein the semiconductor product tool is at least one of a handling tool and a processing tool.

9. The metrology device according to claim 1, wherein said support forms part of said housing preserving said inner atmosphere.

10. The metrology device according to claim 1, wherein said support accommodates said measuring device.

11. The metrology device according to claim 1, wherein said support contains means for adapting a position of the metrology device to different load port sizes.

12. The metrology device according to claim 1, wherein said coupling region has an opening formed therein and a semiconductor product is received through said opening of said coupling region to perform a measurement inside said housing.

13. The metrology device according to claim 1, wherein said transport device is formed of rollers.

14. The metrology device according to claim 1, wherein said support includes a docking region mechanically dockable to the semiconductor product tool.

15. The metrology device according to claim 14, wherein at least one of said coupling region and said docking region contains members for fixing a position of the metrology device relative to the semiconductor product tool.

16. The metrology device according to claim 14, wherein said docking region contains a conduct region coupleable to the semiconductor product tool.

17. The metrology device according to claim 16, wherein said conduct region provides data transfer, power, pressured gas or other media from the semiconductor product tool to the metrology device.

18. The metrology device according to claim 12, wherein said coupling region contains a seal surrounding said opening.

19. The metrology device according to claim 1, wherein at least one of said coupling region and said support contains elements for vibration damping.

20. The metrology device according to claim 1, including a table for vibration damping.

21. The metrology device according to claim 1, wherein the metrology device is a cluster device containing said measuring device for measuring at least two properties of the semiconductor product.

22. A system, comprising:

a load port for a semiconductor product handling/processing tool, the semiconductor product handling/processing tool enclosing a mini-environmental atmosphere and having a load port table for supporting devices to be coupled to said load port, the load port table having contact members including cinematic coupling pins; and a metrology device couplable to said load port, said metrology device containing:
a housing preserving an inner atmosphere;
a coupling region for connecting said inner atmosphere to the mini-environmental atmosphere and extending from said housing;
a measuring device for measuring a property of a semiconductor product;
a transport device;
a support supported by and movable over ground by said transport device, said support supporting said housing and said measuring device, said support dimensioned to cause the metrology device to be self-supporting in a position appropriate for coupling said coupling region to said load port without contacting the contact members of said load port table.

* * * * *